United States Patent
Wei et al.

(10) Patent No.: US 9,771,267 B2
(45) Date of Patent: *Sep. 26, 2017

(54) METHOD FOR MAKING CARBON NANOTUBE NEEDLE

(71) Applicants: Tsinghua University, Beijing (CN); HON HAI PRECISION INDUSTRY CO., LTD., New Taipei (TW)

(72) Inventors: Yang Wei, Beijing (CN); Liang Liu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 863 days.

This patent is subject to a terminal disclaimer.

(21) Appl. No.: 14/040,582

(22) Filed: Sep. 27, 2013

(65) Prior Publication Data

US 2014/0027404 A1    Jan. 30, 2014

Related U.S. Application Data

(63) Continuation of application No. 12/313,935, filed on Nov. 26, 2008, now abandoned.

(30) Foreign Application Priority Data

Mar. 19, 2008    (CN) .......................... 2008 1 0661282

(51) Int. Cl.
  *C01B 31/02*    (2006.01)
  *D01F 9/12*    (2006.01)
  (Continued)

(52) U.S. Cl.
  CPC ...... *C01B 31/0253* (2013.01); *B81C 1/00111* (2013.01); *B82Y 30/00* (2013.01);
  (Continued)

(58) Field of Classification Search
  CPC ... B82Y 30/00; B82Y 40/00; Y10T 428/2982; B81B 2201/055; C01B 31/0253;
  (Continued)

(56) References Cited

U.S. PATENT DOCUMENTS 7,914,358 B2 *    3/2011    Wei ..................... H01J 1/304
                                                    423/447.1
2003/0186625 A1 *  10/2003   Nakayama ............. B82Y 10/00
                                                        451/28
(Continued)

FOREIGN PATENT DOCUMENTS

JP    2007093294 A    *    4/2007

OTHER PUBLICATIONS

Zhang et al., Spinning and processing continuous yarns from 4-inch wafer scale super-aligned carbon nanotube arrays, 2006, Advanced Materials, 18.12, 1505-1510.*

(Continued)

*Primary Examiner* — Alison L Hindenlang
*Assistant Examiner* — Jerzi H Moreno Hernandez
(74) *Attorney, Agent, or Firm* — Steven Reiss

(57) ABSTRACT

A method for manufacturing a carbon nanotube needle is provided. A carbon nanotube film comprising of a plurality of commonly aligned carbon nanotubes, a first electrode, and a second electrode are provided. The carbon nanotube film is fixed to the first electrode and the second electrode. An organic solvent is applied to treat the carbon nanotube film to form at least one carbon nanotube string. A voltage is applied to the carbon nanotube string until the carbon nanotube string snaps.

10 Claims, 10 Drawing Sheets

(51) Int. Cl.
*B81C 1/00* (2006.01)
*B82Y 30/00* (2011.01)
*B82Y 40/00* (2011.01)

(52) U.S. Cl.
CPC .......... *B82Y 40/00* (2013.01); *C01B 31/0233* (2013.01); *B81B 2201/055* (2013.01); *C01B 2202/02* (2013.01); *C01B 2202/04* (2013.01); *C01B 2202/06* (2013.01); *C01B 2202/08* (2013.01); *C01B 2202/34* (2013.01); *C01B 2202/36* (2013.01); *Y10T 428/2982* (2015.01)

(58) Field of Classification Search
CPC ............ C01B 31/0233; C01B 2202/04; C01B 2202/06; C01B 2202/08; C01B 2202/34; C01B 2202/36; C01B 2202/02
See application file for complete search history.

(56) References Cited

U.S. PATENT DOCUMENTS

| | | | |
|---|---|---|---|
| 2007/0035227 A1* | 2/2007 | Haba ..................... | H01J 1/304 313/309 |
| 2007/0166223 A1* | 7/2007 | Jiang ..................... | B82Y 30/00 423/447.1 |
| 2009/0115306 A1* | 5/2009 | Wei ........................ | H01J 1/304 313/309 |

OTHER PUBLICATIONS

Huang et al., Atomic-scale imaging of wall-by-wall breakdown and concurrent transport measurements in multiwall carbon nanotubes, 2005, Physical review letters, 94.23, 236802 (1-4).*

Wei et al., Vacuum-breakdown-induced needle-shaped ends of multiwalled carbon nanotube yarns and their field emission applications, 2007, Nano Letters, 7.12, 3792-3797.*

* cited by examiner

METHOD FOR MAKING CARBON NANOTUBE NEEDLE

This application is a continuation application of U.S. patent application Ser. No. 12/313,935, filed on Nov. 26, 2008, entitled "CARBON NANOTUBE NEEDLE AND METHOD FOR MAKING THE SAME RELATED APPLICATIONS", which claims all benefits accruing under 35 U.S.C. §119 from China Patent Applications No. 200810066128.2, filed on Mar. 19, 2008, in the China Intellectual Property Office. This application is related to commonly-assigned application Ser. No. 12/313,937, entitled "METHOD FOR MAKING FIELD EMISSION ELECTRON SOURCE HAVING CARBON NANOTUBES", filed on Nov. 26, 2008; Ser. No. 12/313,932, entitled "FIELD EMISSION ELECTRON SOURCE HAVING CARBON NANOTUBES", filed on Nov. 26, 2008; Ser. No. 12/313,938, entitled "ELECTRON EMISSION APPARATUS", filed on Nov. 26, 2008; Ser. No. 12/313,934, entitled "ELECTRON EMISSION APPARATUS AND METHOD FOR MAKING THE SAME", filed on Nov. 26, 2008. The disclosure of the respective above-identified application is incorporated herein by reference.

BACKGROUND

1. Technical Field

The disclosure relates to a carbon nanotube needle and the method for making the same.

2. Discussion of Related Art

Carbon nanotubes (CNTs) produced by means of arc discharge between graphite rods were first discovered and reported in an article by Sumio Iijima, entitled "Helical Microtubules of Graphitic Carbon" (Nature, Vol. 354, Nov. 7, 1991, pp. 56-58). CNTs also feature extremely high electrical conductivity, very small diameters (much less than 100 nanometers), large aspect ratios (i.e. length/diameter ratios greater than 1000), and a tip-surface area near the theoretical limit (the smaller the tip-surface area, the more concentrated the electric field, and the greater the field enhancement factor). These features tend to make CNTs ideal candidates for use in many materials and devices, such as composite materials, field emission devices, and micro electrical devices.

Generally, the tip-surface area of a CNT is very small. A single CNT is often used as a needle (i.e., probe, or sharp tip structure) connected to a base. The CNT needle with the base is used as a field emission electron source or a detecting probe. The methods adopted for forming the CNT needle with base mainly include mechanical and in situ synthesis methods. One mechanical method involves coating a base (or a cantilever of an atomic force microscope (AFM)) with an adhesive and touching it to a CNT array, and pulling one CNT away adhered to the base. However, because CNTs are so small, using this method is hard to control. Further, the CNT needle may easily separate from the base. Thus, the performance of the field emission electron source or detecting probe of AFM will be decreased and have short life.

One in-situ synthesis method is performed by coating metal catalysts on a base and synthesizing a CNT directly on the base by means of chemical vapor deposition (CVD). However, because CNTs have a small diameter, the interface of the CNT and the base will be small, and the mechanical connection between the CNT and the base will generally be relatively weak and, thus, unreliable. Further, it is difficult to grow only one CNT on the base.

What is needed, therefore, is an improved CNT needle and method for making same.

BRIEF DESCRIPTION OF THE DRAWINGS

Many aspects of the present CNT needle can be better understood with references to the following drawings. The components in the drawings are not necessarily drawn to scale, the emphasis instead being placed upon clearly illustrating the principles of the present CNT needle.

Figure 1:
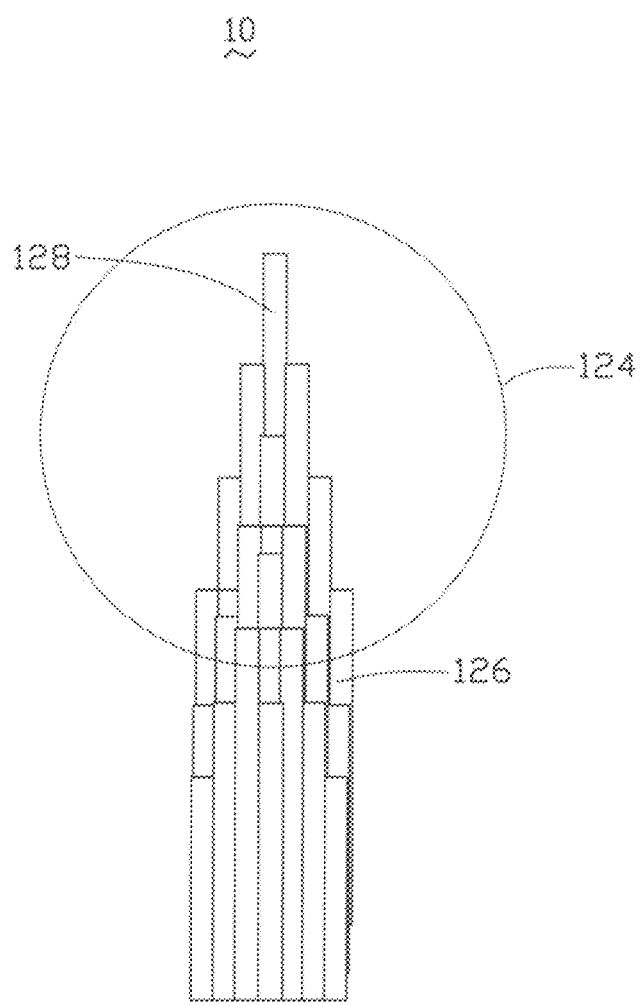
FIG. 1 is a representation a CNT needle in accordance with a present embodiment.

Corresponding reference characters indicate corresponding parts throughout the several views. The exemplifications set out herein illustrate at least one embodiment of the present method, in one form, and such exemplifications are not to be construed as limiting the scope of the invention in any manner.

DETAILED DESCRIPTION

References will now be made to the drawings to describe the exemplary embodiments of the present CNT needle and the method for manufacturing the CNT needle, in detail.

Figure 2:
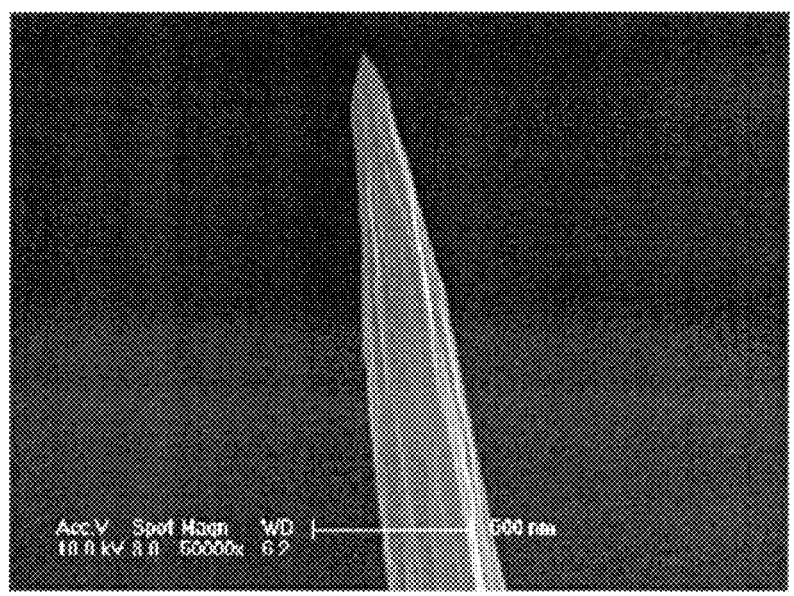
FIG. 2 shows a Scanning Electron Microscope (SEM) image of a CNT needle.
Figure 3:
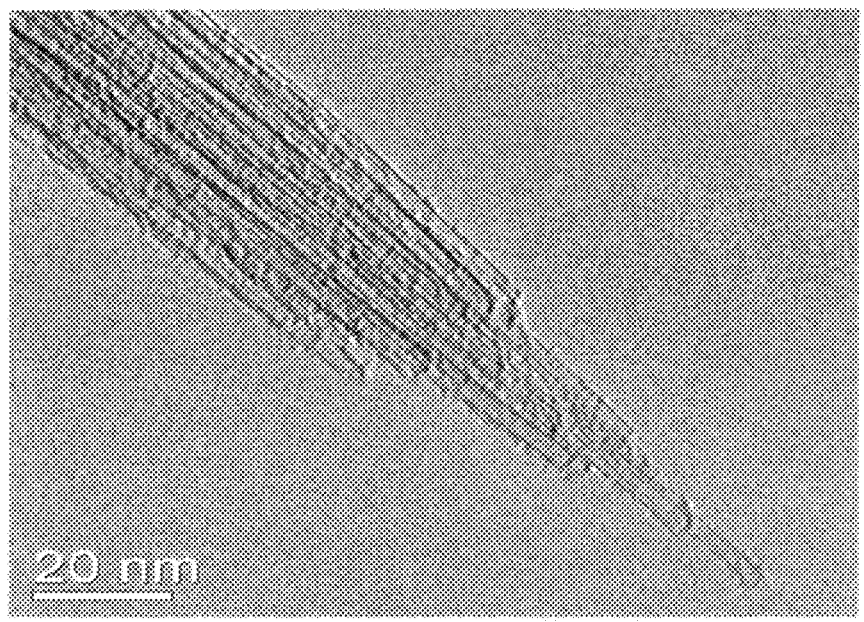
FIG. 3 shows a Transmission Electron Microscope (TEM) image of a CNT needle.

Referring to FIG. 1, the CNT needle 10 is composed of a CNT string. Each CNT string includes a plurality of continuously oriented and substantially parallel CNTs joined end-to-end by van der Waals attractive force. A diameter of the CNT needle 10 approximately ranges from 1 to 20 microns, and a length thereof ranges from 0.01 to 1 millimeters. The CNT needle 12 includes an end portion 122 and a broken end portion 124. Referring to FIGS. 2 and 3, the CNTs at the broken end portion 124 form a similar tapered-shaped structure. One CNT 126 protrudes from the adjacent CNTs to form a tip 128 of the CNT needle 10. The CNT 126 protrudes from the adjacent CNTs about 5 nanometers to 50 nanometers. The CNTs at the broken end portion 124 have smaller diameters and a fewer number of walls, typically, less than 5 nanometers (nm) in diameter and have less than 2-3 walls. However, the CNTs 126 in the CNT needle 10 other than the broken end portion 124 includes single-walled CNTs, double-walled CNTs, or multi-walled CNTs. Diameters of the single-walled CNTs, the double-walled CNTs, and the multi-walled CNTs can, respectively, be in an approximate range from 0.5 to 50 nanometers, 1 to 50 nanometers, and 1.5 to 50 nanometers.

Figure 4:
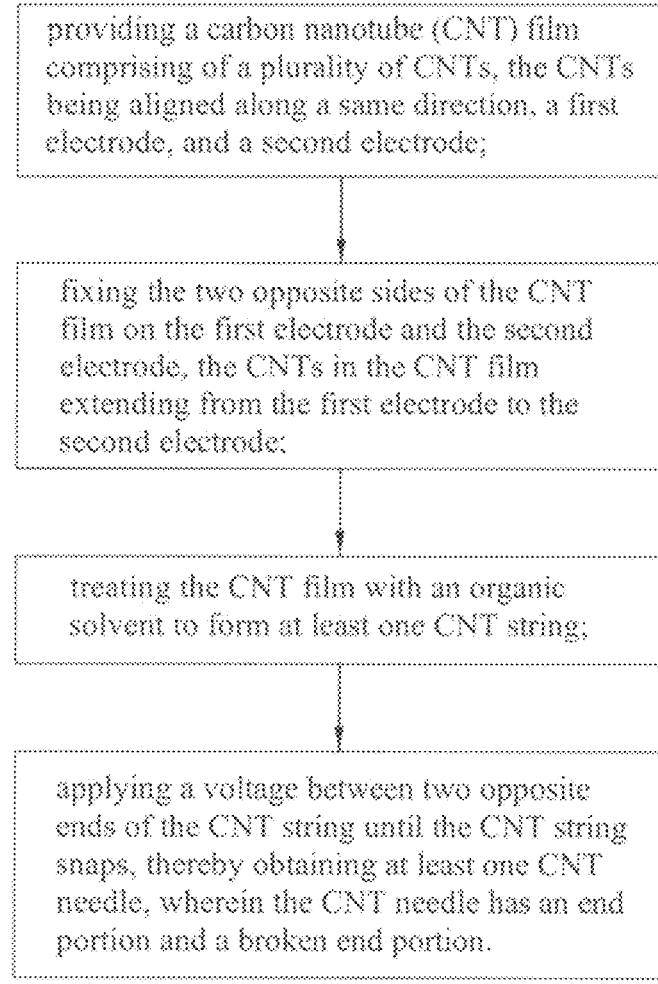
FIG. 4 is a flow chart of a method for manufacturing a CNT needle, in accordance with a present embodiment.
Figure 6:
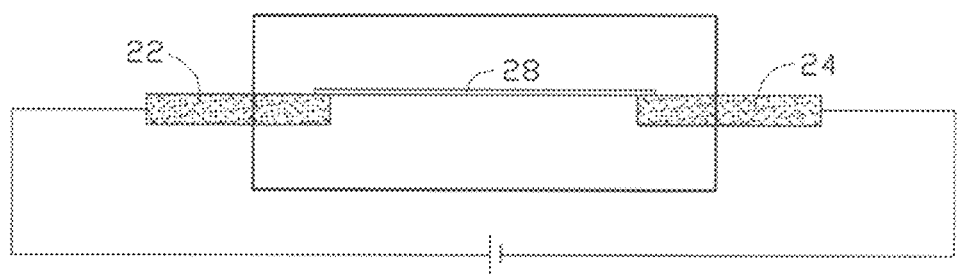
FIG. 6 is a schematic view of an apparatus for fusing CNT strings.

Referring to FIG. 4 and FIG. 6, a method for manufacturing the CNT needle 10 includes the following steps: (a) providing a CNT film having a plurality of CNTs therein, the CNTs being aligned along a same direction, a first electrode 22 and a second electrode 24 (b) fixing the two opposite sides of the CNT film on the first electrode 22 and the second electrode 22 respectively, the CNTs in the CNT film extending from the first electrode 22 to the second electrode 24; (c) treating the CNT film with an organic solvent to form a plurality of CNT strings 28; and (d) applying a voltage between two opposite ends of the CNT strings via the first electrode and the second electrode, until the CNT strings snap/break at a certain points thereof, to achieve a number of CNT needles 10.

In step (a), the CNT film is formed by the following substeps: (a1) providing a CNT array; and (a2) pulling out a CNT film from the array of CNTs, by using a tool (e.g., adhesive tape, pliers, tweezers, or another tool allowing multiple CNTs to be gripped and pulled simultaneously).

In step (a1), initially, a substrate is provided, and the substrate is a P-type silicon or N-type silicon substrate. Secondly, a catalyst layer is deposited on the substrate. The catalyst layer is made of a material selected from a group consisting of iron (Fe), cobalt (Co), nickel (Ni), and their alloys. Thirdly, the substrate with the catalyst layer is annealed at a temperature approximately ranging from 700 to 900 degrees centigrade (° C.) under a protecting gas for approximately 30 minutes to 90 minutes. Fourthly, the substrate with the catalyst layer is heated to a temperature approximately ranging from 500° C. to 740° C. and a mixed gas including a carbon containing gas and a protecting gas is introduced for approximately 5 to 30 minutes to grow a super-aligned CNTs array. The carbon containing gas is a hydrocarbon gas, such as acetylene or ethane. The protecting gas is an inert gas. The grown CNTs are aligned in columns parallel to each other and held together by van der Waals force interactions therebetween. The CNTs array has a high density and each of the CNTs has an essentially uniform diameter.

In step (a2), the CNT film can be formed by the substeps of: (a21) selecting one or more CNTs having a predetermined width from the super-aligned array of CNTs; and (a22) pulling the CNTs to from nanotube segments at an even/uniform speed to achieve a uniform CNT film. In step (a21), the CNT segment having a predetermined width includes a plurality of CNTs parallel to each other. The CNT segment is gripped by using an adhesive tape such as the tool to contact the super-aligned array. In step (a22), the pulling direction is substantially perpendicular to the growing direction of the super-aligned array of CNTs.

More specifically, during the pulling process, as the initial CNT segments are drawn out, other CNT segments are also drawn out end to end due to van der Waals attractive force between ends of adjacent segments. This process of drawing ensures a substantially continuous and uniform CNT film having a predetermined width can be formed. The CNT film includes a plurality of CNTs joined ends to ends. The CNTs in the CNT film are all substantially parallel to the pulling/drawing direction of the CNT film, and the CNT film produced in such manner can be selectively formed to have a predetermined width. The CNT film formed by the pulling/drawing method has superior uniformity of thickness and conductivity over a typical disordered CNT film. Further, the pulling/drawing method is simple, fast, and suitable for industrial applications.

The width of the CNT film depends on a size of the CNT array. The length of the CNT film can be arbitrarily set, as desired. In one useful embodiment, when the substrate is a 4-inch P-type silicon wafer as in the present embodiment, the width of the CNT film is in an approximate range from 0.01 centimeter to 10 centimeters, and the thickness of the CNT film is in an approximate range from 0.5 nanometers to 100 microns. The CNTs in the CNT film includes single-walled CNTs, double-walled CNTs, or multi-walled CNTs. Diameters of the single-walled CNTs, the double-walled CNTs, and the multi-walled CNTs can, respectively, be in an approximate range from 0.5 to 50 nanometers, 1 to 50 nanometers, and 1.5 to 50 nanometers.

In step (b), the first electrode and the second electrode are separated from each other. A distance between the first electrode and the second electrode ranges from 50 micrometers to 1 millimeter. The CNT film is suspended between the first electrode and the second electrode and tensioned thereby.

Figure 5:
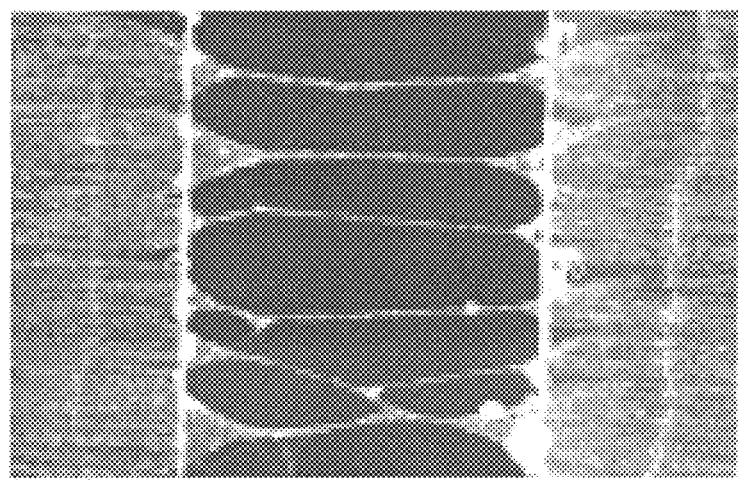
FIG. 5 shows an image of a CNT film treated by an organic solvent.

Referring to FIG. 5, step (c) can be executed by putting the organic solvent onto the CNT film or putting the CNT film with the first electrode and the second electrode in the organic solvent to soak the entire surfaces of the CNT film. Since the untreated CNT film is composed of a number of the CNTs, the untreated CNT film has a high surface-area-to-volume ratio and, thus, may easily become stuck to other objects. During the surface treatment, the impending CNT film is shrunk into a plurality of CNT strings after the organic solvent volatilizing, due to factors such as surface tension. The CNT string includes a plurality of CNTs, the CNTs being aligned along a same direction. The surface area to volume ratio is reduced. Accordingly, the stickiness of the CNT film is lowered, and strength and toughness of the CNT string is improved. The organic solvent may be a volatilizable organic solvent, such as ethanol, methanol, acetone, dichloroethane, chloroform, or any appropriate mixture thereof.

Figure 7:
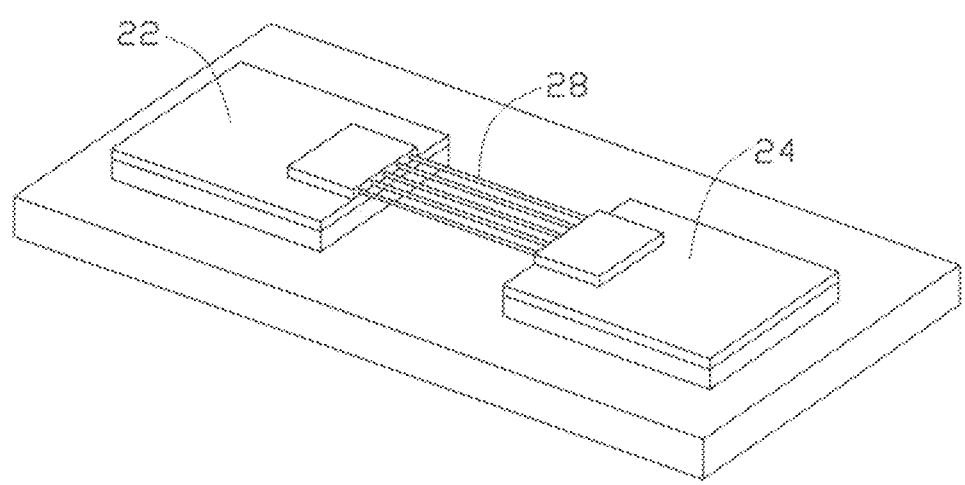
FIG. 7 is a schematic view before fusing the CNT strings of FIG. 6.
Figure 8:
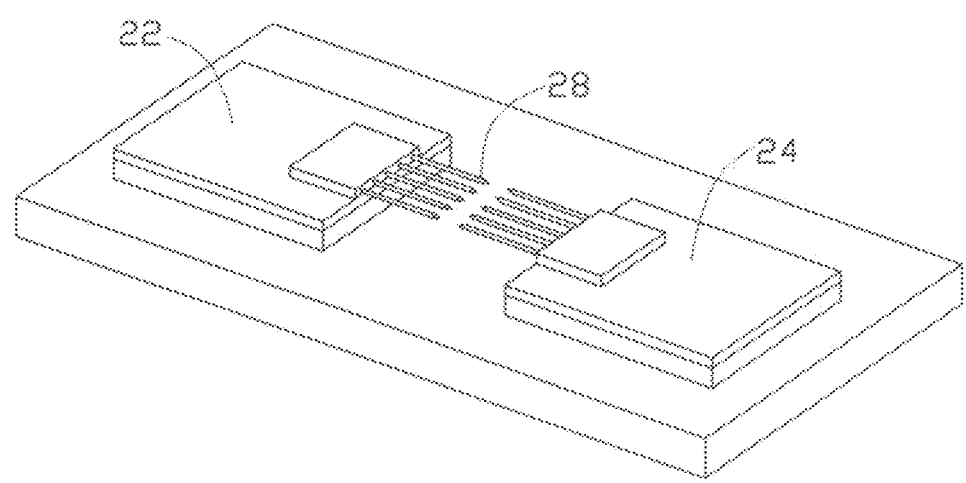
FIG. 8 is a schematic view after fusing the CNT strings of FIG. 6.

Referring to FIGS. 6, 7 and 8, the step (d) includes the following substeps: (d1) placing the CNT strings, along with the first electrode 22 connected to the second electrode 24 in a chamber 20; (d2) applying a voltage between two opposite ends of the CNT strings 28 via the first electrode 22 and the second electrode 24 of such a magnitude and/or time to cause the CNT strings 28 to snap. The strings snap at a middle point along an axis thereof and, thus, acquiring two CNT needles 10 for each string.

In step (d1), the chamber 20 is a vacuum or filled with an inert gas. A diameter of the CNT string 28 approximately ranges from 1 to 20 micrometers, and a length thereof approximately ranges from 0.05 millimeters to 1 millimeter. In the present embodiment, the vacuum chamber 20 can be a vacuum and the pressure thereof is lower than $1\times10^{-1}$ Pascal (Pa).

In step (d2), the voltage can be set according to a diameter and/or a length of the CNT strings 28. In the present embodiment, when a length of the CNT string 28 is 300 μm and a diameter thereof is 2 μm, the voltage is 40 volts (V). A vacuum of the chamber 20 is less than $2\times10^{-5}$ Pascal (Pa). In the present embodiment, vacuum of the chamber 20 is $2\times10^{-5}$ Pa.

Figure 9:
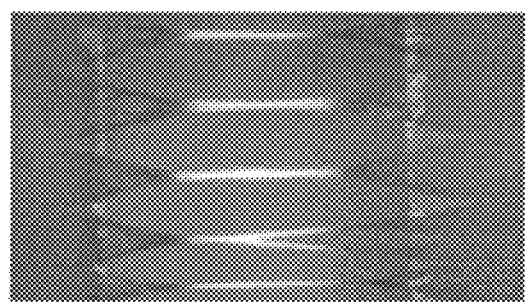
FIG. 9 shows an image of CNT strings in an incandescent state.

Referring to FIG. 9, in step (d2), a temperature of the CNT string 28 increases due to Joule-heating, and the CNT string 28 can reach a temperature approximately ranging from 2000 to 2400 Kelvin (K). When the temperature of the CNT string 28 is high enough, the CNT string 28 is in an incandescent state. Heat in the CNT string 28 is transmitted from the CNT to the electrodes. Since the middle point of the CNT string is furthest from the electrodes, the temperature thereof is highest, and then the CNT string 28 is broken at the middle point. In the present embodiment, after less than 1 hour, the CNT string 28 is snapped at the middle point.

Referring to FIG. 8, the CNT string 28 breaks at the middle point to form two CNT needles 10. Each CNT needle 10 includes an end portion and an opposite broken end portion. The end portion is fixed on the first electrode or the second electrode. Each CNT needle 10 is composed of well-aligned and firmly compacted CNTs. Referring to FIGS. 2 and 3, the CNTs at the broken end portion 124 have a tapered-shaped structure, i.e., one CNT protruding and higher than the adjacent CNTs. That is because during snapping, some carbon atoms vaporize from the CNT string 12. After snapping, a micro-fissure (not labeled) is formed between two break-end portions, the arc discharge may occur between the micro-fissure, and then carbon atoms transform into carbon ions due to ionization. These carbon ions bombard/etch the break-end portions, and then the break-end portion 124 forms the taper-shaped structure.

Figure 10:
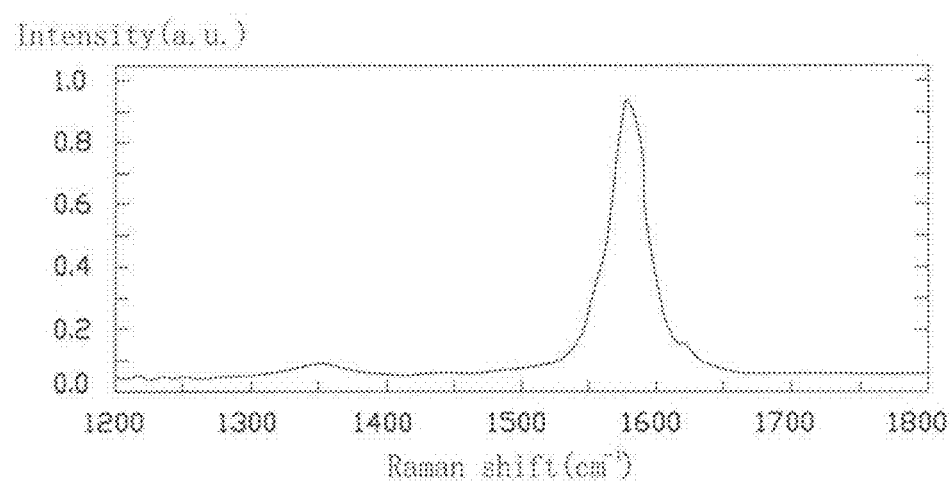
FIG. 10 is a graph showing Raman spectrum of an emission tip of the CNT needle of FIG. 1.

The CNTs at the broken end portion have smaller diameters and a fewer number of walls, typically in the present embodiment, less than 5 nanometers in diameter and only about 2-3 walls. However, the CNTs away from the break-end portion are about 15 nm in diameter and have more than 5 walls. The diameter and the number of the walls of the CNTs are decreased in the vacuum breakdown process. A wall-by-wall breakdown of CNTs is due to Joule-heating at a temperature higher than 2000K, with a current decrease process. The high-temperature process can efficiently remove the defects in CNTs and, consequently, improve electric and thermal conductivities and mechanical strength thereof. FIG. 10 shows a Raman spectrum of the break-end portion 124. After snapping, the intensity of D-band (defect mode) at 1580 cm$^{-1}$ is reduced, which indicates the structure effects at the break-end portion 124 are effectively removed.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that above description and the claims drawn to a method may include some indication in reference to certain steps. However, the indication used is only to be viewed for identification purposes and not as a suggestion as to an order for the steps.

What is claimed is:

1. A method, for manufacturing a carbon nanotube needle, comprising:
    providing a carbon nanotube film comprising a plurality of aligned carbon nanotubes, a first electrode, and a second electrode;
    fixing the carbon nanotube film to the first electrode and the second electrode, wherein the plurality of aligned carbon nanotubes extends from the first electrode to the second electrode, a distance between the first electrode and the second electrode ranges from 50 micrometers to 2 millimeters;
    treating the carbon nanotube film with an organic solvent to form a plurality of carbon nanotube strings after the carbon nanotube film fixed to the first electrode and the second electrode; and
    applying a voltage to the plurality of carbon nanotube strings until the plurality of carbon nanotube strings snap.

2. The method as claimed in claim 1, wherein the providing the carbon nanotube film comprises:
    providing an array of carbon nanotubes; and
    pulling out the carbon nanotube film from the array of carbon nanotubes.

3. The method as claimed in claim 1, wherein the organic solvent is a volatile organic solvent and selected from the group consisting of ethanol, methanol, acetone, dichloroethane, and chloroform.

4. The method as claimed in claim 1, wherein the treating the carbon nanotube film with the organic solvent comprises putting the organic solvent onto the carbon nanotube film or putting the carbon nanotube film into the organic solvent.

5. The method as claimed in claim 1, wherein the applying the voltage to the plurality of carbon nanotube strings comprises:
    placing the first electrode and the second electrode with the plurality of carbon nanotube strings thereon in a chamber; and
    applying the voltage between two opposite ends of the plurality of carbon nanotube strings via the first electrode and the second electrode for a period of time to snap the plurality of carbon nanotube strings, thereby acquiring at least one carbon nanotube needle with a broken end.

6. The method as claimed in claim 5, wherein the plurality of carbon nanotube strings reaches a temperature ranging from about 2000 kelvins to about 2400 kelvins before snapping.

7. The method as claimed in claim 1, wherein a width of the carbon nanotube film is in an range from about 0.01 centimeters to about 10 centimeters.

8. The method as claimed in claim 1, wherein a thickness of the carbon nanotube film is in an range from about 0.5 nanometers to about 100 microns.

9. The method as claimed in claim 1, wherein a diameter of each of the plurality of carbon nanotube strings ranges from about 1 micrometer to about 20 micrometers.

10. The method as claimed in claim 1, wherein a length of each of the plurality of carbon nanotube strings ranges from about 0.05 millimeters to about 1 millimeter.

* * * * *